(12) United States Patent
Hadwen et al.

(10) Patent No.: US 10,859,813 B2
(45) Date of Patent: Dec. 8, 2020

(54) OPTICALLY BLACK AM-EWOD ARRAY ELEMENT STRUCTURE

(71) Applicant: Sharp Life Science (EU) Limited, Oxford (GB)

(72) Inventors: Benjamin James Hadwen, Oxford (GB); Philip Mark Shryane Roberts, Oxford (GB)

(73) Assignee: Sharp Life Science (EU) Limited, Oxford (GB)

( * ) Notice: Subject to any disclaimer, the term of this patent is extended or adjusted under 35 U.S.C. 154(b) by 244 days.

(21) Appl. No.: 16/026,162

(22) Filed: Jul. 3, 2018

(65) Prior Publication Data
US 2020/0012089 A1 Jan. 9, 2020

(51) Int. Cl.
*G02B 26/00* (2006.01)
*H01L 27/12* (2006.01)

(52) U.S. Cl.
CPC ........ *G02B 26/005* (2013.01); *H01L 27/1248* (2013.01)

(58) Field of Classification Search
CPC .............................. G02B 26/005; G02B 26/004
See application file for complete search history.

(56) References Cited

U.S. PATENT DOCUMENTS

| | | | |
|---|---|---|---|
| 6,017,780 A | 1/2000 | Roy | |
| 7,163,612 B2 | 1/2007 | Sterling et al. | |
| 8,313,698 B2 | 11/2012 | Pollack et al. | |
| 10,288,871 B1 * | 5/2019 | Kumar | H01L 29/78633 |
| 2018/0085756 A1 * | 3/2018 | Kosaka | B01L 3/502784 |

OTHER PUBLICATIONS

Fair, R.B., "Digital microfluids: is a true lab-on-a-chip possible?" Microfluidics and Nanofluidics Jun. 2007, vol. 3, Issue 3, pp. 245-281.
Barberoglou et al.: "Electrowetting Properties of Micro/Nanostructured Black Silicon" Langmuir, 2010, 26 (15) pp. 13007-13014.
Klauk et al.: "Hydrogenated amorphous silicon germanium black-matrix material for active-matrix liquid-crystal displays", Journal of the Society for Information Display, vol. 5, Issue 4, Dec. 1997 (Abstract Only).

* cited by examiner

*Primary Examiner* — Joseph P Martinez
(74) *Attorney, Agent, or Firm* — Renner, Otto, Boisselle & Sklar, LLP

(57) ABSTRACT

An active matrix electro-wetting on dielectric (AM-EWOD) device has an optically black array element structure to enhance optical detection of constituents within a liquid droplet. The AM-EWOD device includes a thin film transistor (TFT) substrate assembly having a hydrophobic layer; thin film electronics having a plurality of array elements arranged in an array of rows and columns, each of the array elements including an array element electrode and a TFT device; and an optically black material disposed between a plane of the TFT device and the hydrophobic layer. The TFT substrate assembly further includes a planarization structure that includes a component having the optically black material. The planarization structure has a planarization component disposed between the TFT device and the array element electrode, and an ionic barrier disposed between the array element electrode and the hydrophobic coating. The planarization component or the ionic barrier includes the optically black material.

20 Claims, 8 Drawing Sheets

OPTICALLY BLACK AM-EWOD ARRAY ELEMENT STRUCTURE

TECHNICAL FIELD

The present invention relates to droplet microfluidic devices, and more specifically to Active Matrix Electrowetting-On-Dielectric (AM-EWOD) devices and to configurations of the TFT substrate assembly for such a device to optimize optical inspection of droplet constituents.

BACKGROUND ART

Electrowetting on dielectric (EWOD) is a well-known technique for manipulating droplets of fluid by application of an electric field. Active Matrix EWOD (AM-EWOD) refers to implementation of EWOD in an active matrix array incorporating transistors, for example by using thin film transistors (TFTs). It is thus a candidate technology for digital microfluidics for lab-on-a-chip technology. An introduction to the basic principles of the technology can be found in "Digital microfluidics: is a true lab-on-a-chip possible?", R. B. Fair, Microfluid Nanofluid (2007) 3:245-281).

FIG. 1 is a drawing depicting an exemplary EWOD based microfluidic system. In the example of FIG. 1, the microfluidic system includes a reader 32 and a cartridge 34. The cartridge 34 may contain a microfluidic device, such as an AM-EWOD device 36, as well as (not shown) fluid input ports into the device and an electrical connection as are conventional. The fluid input ports may perform the function of inputting fluid into the AM-EWOD device 36 and generating droplets within the device, for example by dispensing from input reservoirs as controlled by electrowetting. As is further detailed below, the microfluidic device includes an electrode array configured to receive the inputted fluid droplets.

The microfluidic system further may include a control system configured to control actuation voltages applied to the electrode array of the microfluidic device to perform manipulation operations to the fluid droplets. For example, the reader 32 may contain such a control system configured as control electronics 38 and a storage device 40 that may store any application software and any data associated with the system. The control electronics 38 may include suitable circuitry and/or processing devices that are configured to carry out various control operations relating to control of the AM-EWOD device 36, such as a CPU, microcontroller or microprocessor.

In the example of FIG. 1, an external sensor module 35 is provided for sensor droplet properties. For example, optical sensors as are known in the art may be employed as external sensors for sensing droplet properties. Suitable optical sensors include camera devices, light sensors, charged coupled devices (CCDs) and similar image sensors, and the like. A sensor, additionally or alternatively, may be configured as internal sensor circuitry incorporated as part of the drive circuitry in each array element. Such sensor circuitry may sense droplet properties by the detection of an electrical property at the array element, such as impedance or capacitance.

FIG. 2 is a drawing depicting additional details of the exemplary AM-EWOD device 36 in schematic perspective. The AM-EWOD device 36 has a lower substrate assembly 44 with thin film electronics 46 disposed upon the lower substrate assembly 44. The thin film electronics 46 are arranged to drive array element electrodes 48. A plurality of array element electrodes 48 are arranged in an electrode or element two-dimensional array 50, having N rows by M columns of array elements where N and M may be any integer. A liquid droplet 52 which may include any polar liquid and which typically may be aqueous, is enclosed between the lower substrate 44 and a top substrate 54 separated by a spacer 56, although it will be appreciated that multiple liquid droplets 52 can be present.

FIG. 3 is a drawing depicting a cross section through some of the array elements of the exemplary AM-EWOD 36 device of FIG. 2. In the portion of the AM-EWOD device depicted in FIG. 3, the device includes a pair of the array element electrodes 48A and 48B that are shown in cross section that may be utilized in the electrode or element array 50 of the AM-EWOD device 36 of FIG. 3. The AM-EWOD device 36 further incorporates the thin-film electronics 46 disposed on the lower substrate 44, which is separated from the upper substrate 54 by the spacer 56. The uppermost layer of the lower substrate 44 (which may be considered a part of the thin film electronics layer 46) is patterned so that a plurality of the array element electrodes 48 (e.g. specific examples of array element electrodes are 48A and 48B in FIG. 3) are realized. The term element electrode 48 may be taken in what follows to refer both to the physical electrode structure 48 associated with a particular array element, and also to the node of an electrical circuit directly connected to this physical structure. A reference electrode 58 is shown in FIG. 3 disposed upon the top substrate 54, but the reference electrode alternatively may be disposed upon the lower substrate 44 to realize an in-plane reference electrode geometry. The term reference electrode 58 may also be taken in what follows to refer to both or either of the physical electrode structure and also to the node of an electrical circuit directly connected to this physical structure.

In the AM-EWOD device 36, a non-polar fluid 60 (e.g. oil) may be used to occupy the volume not occupied by the liquid droplet 52. An insulator layer 62 may be disposed upon the lower substrate 44 that separates the conductive element electrodes 48A and 48B from a first hydrophobic coating 64 upon which the liquid droplet 52 sits with a contact angle 66 represented by θ. The hydrophobic coating is formed from a hydrophobic material (commonly, but not necessarily, a fluoropolymer). On the top substrate 54 is a second hydrophobic coating 68 with which the liquid droplet 52 may come into contact. The reference electrode 58 is interposed between the top substrate 54 and the second hydrophobic coating 68.

The contact angle θ for the liquid droplet is defined as shown in FIG. 3, and is determined by the balancing of the surface tension components between the solid-liquid ($\gamma_{SL}$), liquid-gas ($\gamma_{LG}$) and non-ionic fluid ($\gamma_{SG}$) interfaces, and in the case where no voltages are applied satisfies Young's law, the equation being given by:

$$\cos\theta = \frac{\gamma_{SG} - \gamma_{SL}}{\gamma_{LG}} \qquad \text{(equation 1)}$$

In operation, voltages termed the EW drive voltages, (e.g. $V_T$, $V_0$ and $V_{00}$ in FIG. 3) may be externally applied to different electrodes (e.g. reference electrode 58, element electrodes 48A and 48A, respectively). The resulting electrical forces that are set up effectively control the hydrophobicity of the hydrophobic coating 64. By arranging for different EW drive voltages (e.g. $V_0$ and $V_{00}$) to be applied to different element electrodes (e.g. 48A and 48B), the liquid droplet 52 may be moved in the lateral plane between the two substrates.

U.S. Pat. No. 7,163,612 (Sterling et al., issued Jan. 16, 2007) describes how TFT based thin film electronics may be used to control the addressing of voltage pulses to an EWOD array by using circuit arrangements very similar to those employed in active matrix display technologies. The approach of U.S. Pat. No. 7,163,612 may be termed "Active Matrix Electrowetting on Dielectric" (AM-EWOD). There are several advantages in using TFT based thin film electronics to control an EWOD array, namely:

Electronic driver circuits can be integrated onto the lower substrate.

TFT-based thin film electronics are well suited to the AM-EWOD application. They are cheap to produce so that relatively large substrate areas can be produced at relatively low cost.

TFTs fabricated in standard processes can be designed to operate at much higher voltages than transistors fabricated in standard CMOS processes. This is significant since many EWOD technologies require electrowetting voltages in excess of 20V to be applied.

FIG. 4 is a drawing depicting an exemplary arrangement of thin film electronics 46 in the exemplary AM-EWOD device 36 of FIG. 2. The thin film electronics 46 is located upon the lower substrate 44. Each array element 51 of the array of elements 50 contains an array element circuit 72 for controlling the electrode potential of a corresponding element electrode 48. Integrated row driver 74 and column driver 76 circuits are also implemented in thin film electronics 46 to supply control signals to the array element circuit 72. The array element circuit 72 may also contain a sensor capability for detecting the presence or absence of a liquid droplet in the location of the array element. Integrated sensor row addressing 78 and column detection circuits 80 may further be implemented in thin film electronics for the addressing and readout of the sensor circuitry in each array element.

A serial interface 82 may also be provided to process a serial input data stream and facilitate the programming of the required voltages to the element electrodes 48 in the array 50. A voltage supply interface 84 provides the corresponding supply voltages, top substrate drive voltages, and other requisite voltage inputs as further described herein. A number of connecting wires 86 between the lower substrate 44 and external control electronics, power supplies and any other components can be made relatively few, even for large array sizes. Optionally, the serial data input may be partially parallelized. For example, if two data input lines are used the first may supply data for columns 1 to X/2, and the second for columns (1+X/2) to M with minor modifications to the column driver circuits 76. In this way the rate at which data can be programmed to the array is increased, which is a standard technique used in liquid crystal display driving circuitry.

The description above demonstrates advantages of using a TFT configuration to make the backplane of the AM-EWOD device. This permits a large area for droplet manipulations that is achieved at relatively low cost. Example materials for manufacturing TFT based AM-EWOD devices could be any suitable materials for manufacturing active matrix displays, including for example low temperature polysilicon (LTPS), amorphous-silicon (a-Si), and indium gallium zinc oxide (IGZO), and any suitable related manufacturing processes may be employed.

Even with the advantages of TFT based AM-EWOD devices, analytical challenges remain. In particular, it is often desirable to inspect droplets for the presence of biological cells that may be counted, and detection of just a single cell may be required. This typically is achieved by using an optical marker such as a fluorescence marker. In other words, optical detection is employed to detect the fluorescence of the marker in response to an illuminating source light to determine whether a cell is present. However, appropriate optical inspection of droplet contents by detecting fluorescence, particularly to detect the presence of even a single cell, is complicated by the optical properties of the AM-EWOD device structure. If the detection side electrode is transparent, the planarization layer, common in such configurations, presents background fluorescence, and the underlying TFT structure presents an unwanted background pattern. Using a reflective (metal) electrode as an alternative also is problematic because reflections increase optical cross-talk and compromise imaging ability, which inhibits cell detection and counting in the liquid droplets. This could lead to an erroneous result that suggests there are more than one fluorescent species in the droplet when such detections are based on unwanted reflections.

Related to this field, U.S. Pat. No. 8,313,698 (Pollack et al., issued November 2012) describes a passive (rather than active matrix) EWOD device that uses reflective electrodes to block the light path to underlying fluorescent layers, and teaches coating a droplet micro-actuator surface with a non-fluorescent coating to provide a non-fluorescent detection zone. An article to *Langmuir,* 2010, 26 (15), pp 13007-13014 describes an EWOD device with electrodes formed from blackened silicon, but such electrodes are used to create a super-hydrophobic surface, and optical detection issues are not referenced at all. Others have described ways to enhance planarization layers used in these types of devices, but independently of the issue of improving optical detection in an AM-EWOD device. For example, U.S. Pat. No. 6,017,780 (Roy, issued Jan. 25, 2000) describes an exemplary process for creating a planarized passivation layer in an LCD device. Accordingly, conventional configurations have not adequately addressed issues associated with optical detection of fluorescence in an AM-EWOD device, particularly for single cell detection and related cell counting.

SUMMARY OF INVENTION

The present invention pertains to enhanced configurations of AM-EWOD devices that improve optical detection of fluorescence in an AM-EWOD device, particularly for single cell detection and related cell counting. Optical detection generally is improved by configuring the elements of the AM-EWOD device to have an optically black array element structure. An optically black array element structure facilitates fluorescent detection of the droplet (or species within the droplet, e.g. a cell), without interference of background fluorescence of the planarization layer. Such structure also is non-reflective, which is especially advantageous for detecting a single cell in a droplet by means of fluorescence. In this situation a reflective electrode would be problematic because, as referenced above, reflections increase optical cross-talk and compromise imaging ability, which inhibits cell detection and counting in the liquid droplets. Such structure also is non-transparent. If the electrode were to be transparent, as referenced above, the underlying TFT structure produces an unwanted background pattern, thereby compromising optical analysis of the droplet. Accordingly, the configurations described in this disclosure improve over conventional configurations for cell detection and counting, and are suitable even for single cell detection.

In exemplary embodiments, a modified AM-EWOD device structure includes a blackened planarization layer that is located between a plane of the TFT device and the hydrophobic coating that interfaces with the cell gap in which liquid droplets may be located. For example, an optically black matrix layer may be interposed between the hydrophobic coating and the TFT circuits of the TFT substrate. The black matrix may be instead of or in addition to the standard planarization layers incorporated into AM-EWOD devices. Alternatively, the standard planarization layer may be modified by addition of a black pigment, such as for example graphite. The planarization layer is patterned to facilitate a via connection between the array element electrode and the underlying TFT device within a given array element. An advantage of the disclosed configurations is that an optically black TFT substrate is realized, suitable for applications requiring optical analysis of the liquid droplet properties, including the detection of single cell fluorescence in particular.

An aspect of the invention, therefore, is an enhanced active matrix electro-wetting on dielectric (AM-EWOD) device that has an optically black array element structure to enhance optical detection of constituents within a liquid droplet. In exemplary embodiments, the AM-EWOD device includes a thin film transistor (TFT) substrate assembly having a hydrophobic layer; thin film electronics having a plurality of array elements arranged in an array of rows and columns, each of the array elements including an array element electrode and a TFT device; and an optically black material disposed between a plane of the TFT device and the hydrophobic layer. The AM-EWOD device further includes a second substrate assembly that is spaced apart from the TFT substrate assembly to define a cell gap.

In exemplary embodiments, the TFT substrate assembly further includes a planarization structure that includes a component having the optically black material. The planarization structure may include at least one planarization component disposed between the TFT device and the array element electrode, and an ionic barrier disposed between the array element electrode and the hydrophobic coating. The at least one planarization component or the ionic barrier includes the optically black material.

Another aspect of the invention is a microfluidic system for measuring an optical property of a liquid droplet, which includes the AM-EWOD device according to any of the embodiments, wherein the liquid droplet is received within the cell gap of the AM-EWOD device, and an optical measurement apparatus that measures the optical property of the liquid droplet. The optical measurement apparatus includes an illumination source that emits illumination light rays that illuminate the liquid droplet, wherein a constituent that is present within the liquid droplet is excited by the illumination light rays and emits excitation light rays; and a photodetector that is positioned to detect the excitation light rays, wherein a constituent of the liquid droplet is determined based on the detection of the excitation light rays.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto. Features that are described and/or illustrated with respect to one embodiment may be used in the same way or in a similar way in one or more other embodiments and/or in combination with or instead of the features of the other embodiments.

DESCRIPTION OF EMBODIMENTS

Figure 1:
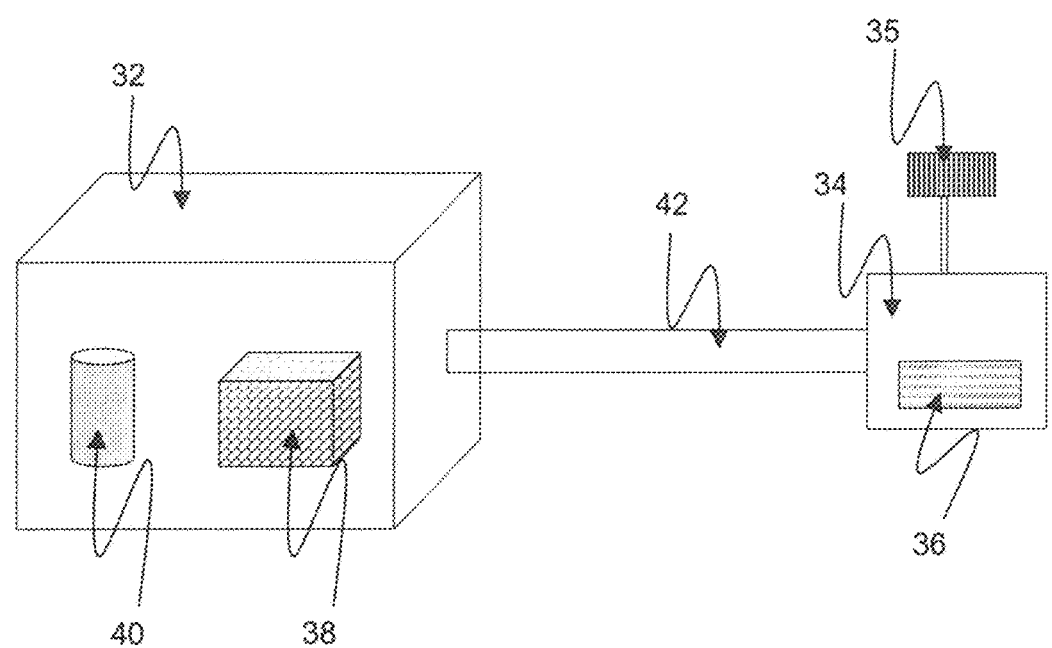
FIG. 1 is a drawing depicting an exemplary EWOD based microfluidic system.

Embodiments of the present invention will now be described with reference to the drawings, wherein like reference numerals are used to refer to like elements throughout. It will be understood that the figures are not necessarily to scale.

The present invention pertains to enhanced configurations of AM-EWOD devices that improve optical detection of fluorescence in an AM-EWOD device, particularly for single cell detection and related cell counting. Optical detection generally is improved by configuring the array elements of the AM-EWOD device to have an optically black array element structure. In exemplary embodiments, a modified AM-EWOD device structure includes a blackened planarization layer that is located between the TFT device, or a plane of the TFT device, and the hydrophobic coating that defines the cell gap in which liquid droplets may be located. The planarization layer is patterned to facilitate a via connection between the array element electrode and the underlying TFT device within a given array element. An advantage of the disclosed configurations is that an optically black TFT substrate is realized, suitable for applications requiring optical analysis of the liquid droplet properties, including the detection of single cell fluorescence in particular.

Figure 5:
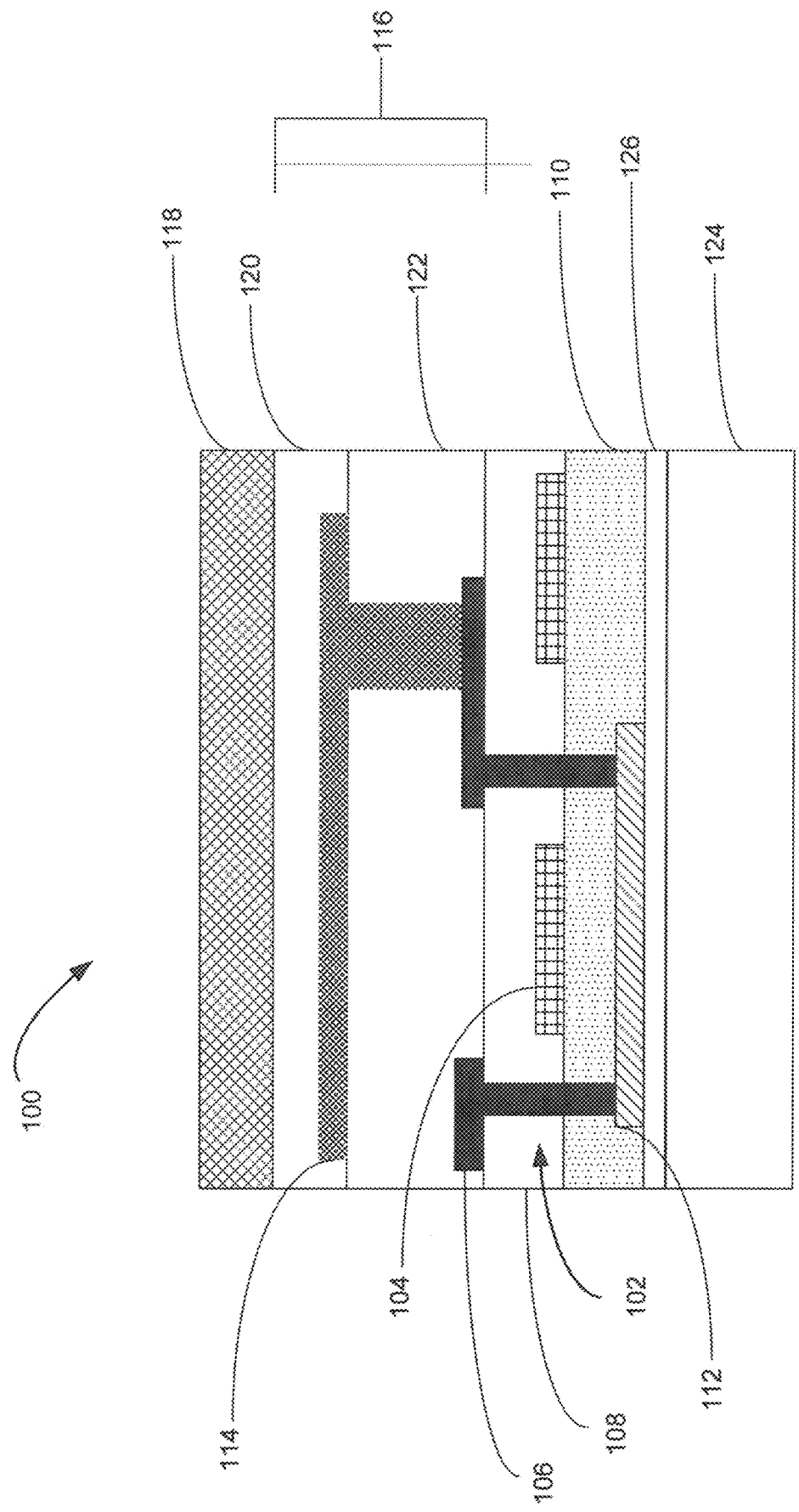
FIG. 5 is a drawing depicting a conventional AM-EWOD layer stack for the TFT substrate assembly.

To illustrate features of the present invention, a comparison may be made to conventional configurations of an array element of an AM-EWOD device. Accordingly, FIG. 5 is a drawing depicting a conventional AM-EWOD layer stack 100 for the TFT substrate assembly in the AM-EWOD device. This layer stack 100 may be formed using standard low temperature polysilicon (LTPS) processing, as used to manufacture the TFT backplane of other active matrix devices, such as for example LCD based displays and the like.

Referring to FIG. 5, the layer stack 100 for the TFT substrate assembly includes a semiconductor based thin film transistor (TFT) device 102 that is contained within the layer stack 100. The TFT device 102 includes a first metal component 104 that constitutes a gate of the TFT device, and a second metal component 106 that constitutes a source and drain of the TFT device. The layer stack further includes an interlayer dielectric 108 and a gate dielectric 110. The first metal component 104 (gate) is embedded within interlayer dielectric 108 and is disposed on the gate dielectric 110. The second metal component 106 (source/drain) extends by patterned via connections through the interlayer dielectric 108 and the gate dielectric 110 to connect to a semiconductor layer 112 to form the source and the drain of the TFT device 102.

The second metal component 106 at one of the source or drain sides is connected to an array element electrode 114. A planarization structure 116 is formed about the second metal component 106 and array element electrode 114 to provide a planar surface. A hydrophobic layer 118, which defines the device cell gap in which liquid droplets may be present, is disposed upon the planarization structure 116.

The planarization structure 116 typically has two sub-layer components including an insulating ion barrier 120 disposed on a planarization layer 122. The ion barrier 120 typically is an inorganic layer, such as for example silicon nitride (SiNx). The ion barrier is conformal relative to the array element electrode and is composed to ensure good electrical insulation between the array element electrode 114 and the hydrophobic layer 118 on which the liquid droplets may be present. The ionic barrier 120 typically will be prepared using a high-density plasma process such as for example chemical vapor deposition, and plasma-enhanced chemical vapor deposition (PECVD) in particular. The planarization layer 122 typically is an organic layer, commonly made of a polymer material such as for example an acrylic resin, acrylic epoxy resin, siloxane resin or a polyimide resin. The organic planarization layer 122 typically will be prepared using conventional process steps including for example: spin coating to deposit a solution of the base layer material in liquid form to create a layer; soft baking to partially cure the layer; patterning the layer to form interconnect vias between the array element electrode 114 and second metal component 106; and hard curing either by baking or by UV light to complete the process. The above layers may be deposited on a base substrate including a glass layer 124 that is coated with a basecoat layer 126.

In conventional configurations such as depicted in FIG. 5, the array element electrode 114 as used in typical LCD technologies is transparent, for example indium tin oxide (ITO) or indium zinc oxide (IZO). Reflective displays may use a reflective electrode, such as for example a metal electrode. In AM-EWOD devices, if there are no requirements for optical detection, the electrode likewise could be either ITO/IZO or metal comparably as used in LCD devices. In addition, in LCD devices there generally is a requirement for the upper surface of the planarization layer to be planar with a surface relief of less than 100 nm. This is necessary for maintenance of the LCD cell gap, typically or order 3-5 µm, to be uniform through the structure. A non-uniform cell gap will result in unacceptable optical artefacts in the displayed image. Similarly, in an AM-EWOD device, there is a preference for the upper surface of the planarization layer to be planar to improve droplet movement through the device, although the tolerance of the planar surface relief is not as strict for an AM-EWOD device as compared to the 100 nm tolerance in an LCD device.

As referenced above, in the present invention optical detection generally is improved by configuring the elements of the AM-EWOD device to have an optically black array element structure. This generally is achieved by incorporating a darkened or optically black layer within the layer stack of the TFT substrate assembly between the TFT device or a plane of the TFT device and the hydrophobic coating that defines the cell gap in which the liquid droplets may be present.

An aspect of the invention, therefore, is an enhanced active matrix electro-wetting on dielectric (AM-EWOD) device that has an optically black array element structure to enhance optical detection of constituents within a liquid droplet. In exemplary embodiments, the AM-EWOD device includes a thin film transistor (TFT) substrate assembly having a hydrophobic layer; thin film electronics having a plurality of array elements arranged in an array of rows and columns, each of the array elements including an array element electrode and a TFT device; and an optically black material disposed between a plane of the TFT device and the hydrophobic layer. The AM-EWOD device further includes a second substrate assembly that is spaced apart from the TFT substrate assembly to define a cell gap.

In exemplary embodiments, the TFT substrate assembly further includes a planarization structure that includes a component having the optically black material. The planarization structure may include at least one planarization component disposed between the TFT device and the array element electrode, and an ionic barrier disposed between the array element electrode and the hydrophobic coating. The at least one planarization component or the ionic barrier includes the optically black material.

Figure 6:
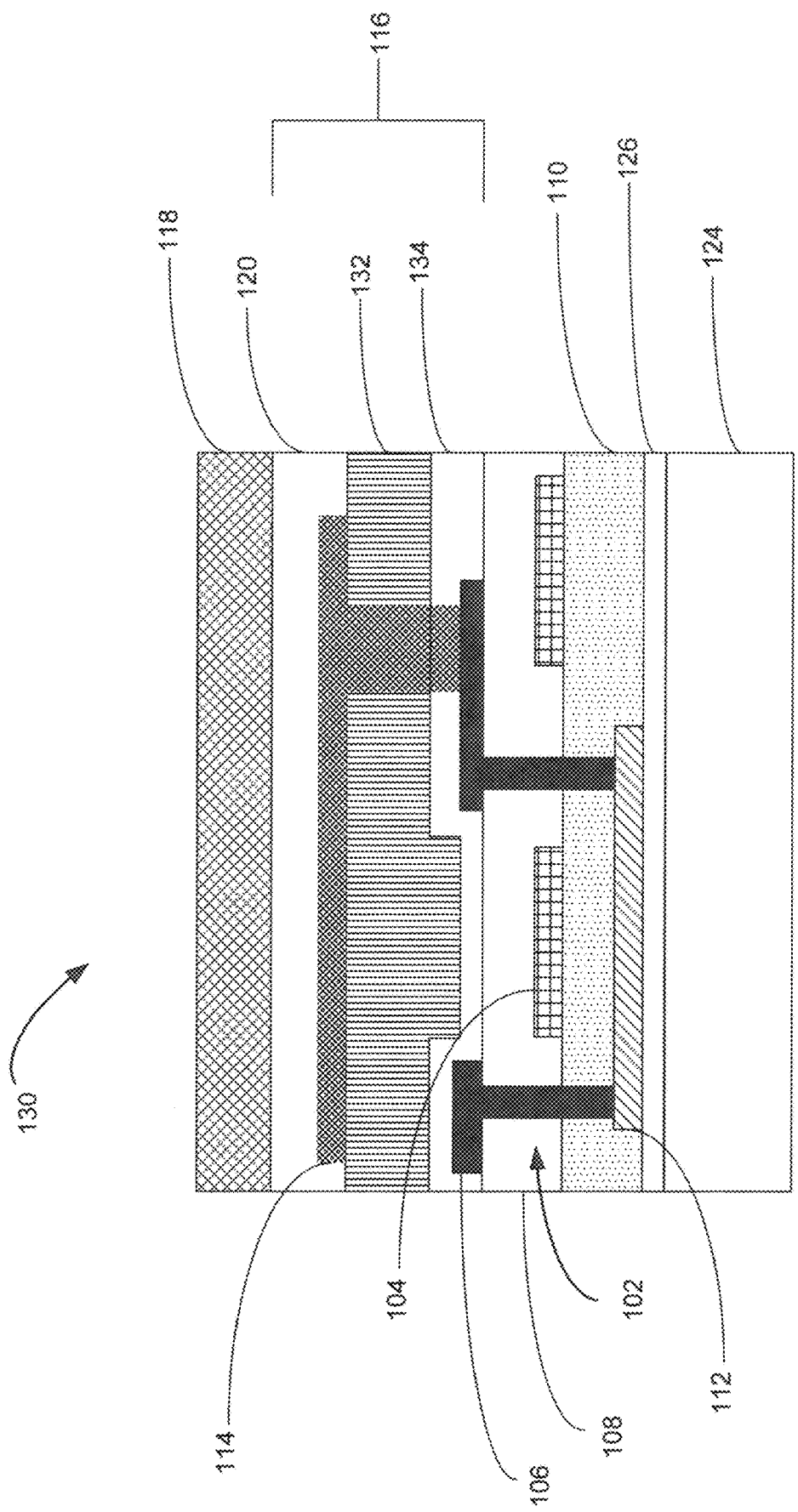
FIG. 6 is a drawing depicting an exemplary AM-EWOD layer stack for the TFT substrate assembly in accordance with embodiments of the present invention.

FIG. 6 is a drawing depicting an exemplary AM-EWOD layer stack 130 for use as the TFT substrate assembly in accordance with embodiments of the present invention. To the extent the layer stack 130 has common components as the conventional layer stack 100 of FIG. 5, like reference numerals are used to identify like components. In this embodiment, at least a portion of the organic planarization layer between the TFT device 102 and the hydrophobic layer 118 is modified to be optically black. In this exemplary embodiment, the organic planarization layer includes at least one planarization component that has the optically black material. In this example there is a first planarization component 132 that is optically black, and a second planarization component 134 that is unmodified relative to the conventional organic planarization polymer material, and thus may not be optically black. The first planarization component 132 may be an upper planarization component, i.e., is closer to the hydrophobic layer 118 relative to the second planarization component 134.

The optically black first planarization component 132 may be formed by modifying the conventional organic polymer material by adding a black dye to the organic polymer material, which is preferably a non-fluorescent black dye. An example dye is sodium 4-amino-5-hydroxy-3-((E)-(4-nitrophenyl)diazenyl)-6-((E)-phenyldiazenyl) naphthalene-2,7-disulfonate, also known as Amido black, such as N749 Black Dye marketed by Sigma Aldrich. In configurations in which the dye itself may include a fluorescent material, a black dye absorber could also be added to the polymer material. Alternatively, the optically black planarization component 132 may be formed by adding an inorganic pigment to the polymer material, such as for example carbon black (para-crystalline silicon), titanium oxide, manganese dioxide, or graphite. These pigments are non-fluorescent and produce scattering optical pathways that are more effective at absorption. The loading of the polymer material with the optically black pigment could, for example, be approximately 40% by volume. As depicted in the example of FIG. 6, the second planarization component 134 may be conformal relative to the configuration of the second metal component 106 of the TFT device, with the first planarization component 132 being conformal relative to the configuration of the second planarization component 134. In this manner, the added dye or pigment material is maintained out of contact with the second metal components 106 so as not to affect performance of the TFT devices.

As an alternative to modifying the conventional organic polymer material of the organic planarization layer by adding a dye or pigment, the optically black planarization component 132 may be formed by replacing the conventional organic polymer material with an alternative material that is natively optically black. An example of a suitable material is amorphous silicon germanium (see "Hydrogenated amorphous silicon germanium black-matrix material for active-matrix liquid-crystal displays", Klauk et al. Vol 5, Issue 4, December 1997), or an alternative black matrix material such as SBM-Series materials marketed by Samyang Corporation, which has been employed in LCD devices. A further alternative material is a standard semiconductor photoresist material modified to include an inorganic pigment to blacken the photoresist material, such as for example conventional SU8 photoresist material to which carbon black is added. As referenced above, it is preferable that the upper surface upon which the electrodes are disposed is planarized, but for AM-EWOD devices the surface relief tolerance is not as strict as with LCD devices. This relaxation of the surface relief tolerance for AM-EWOD devices as compared to LCD devices expands the range of material options for composing the optically black planarization component 132.

Figure 7:
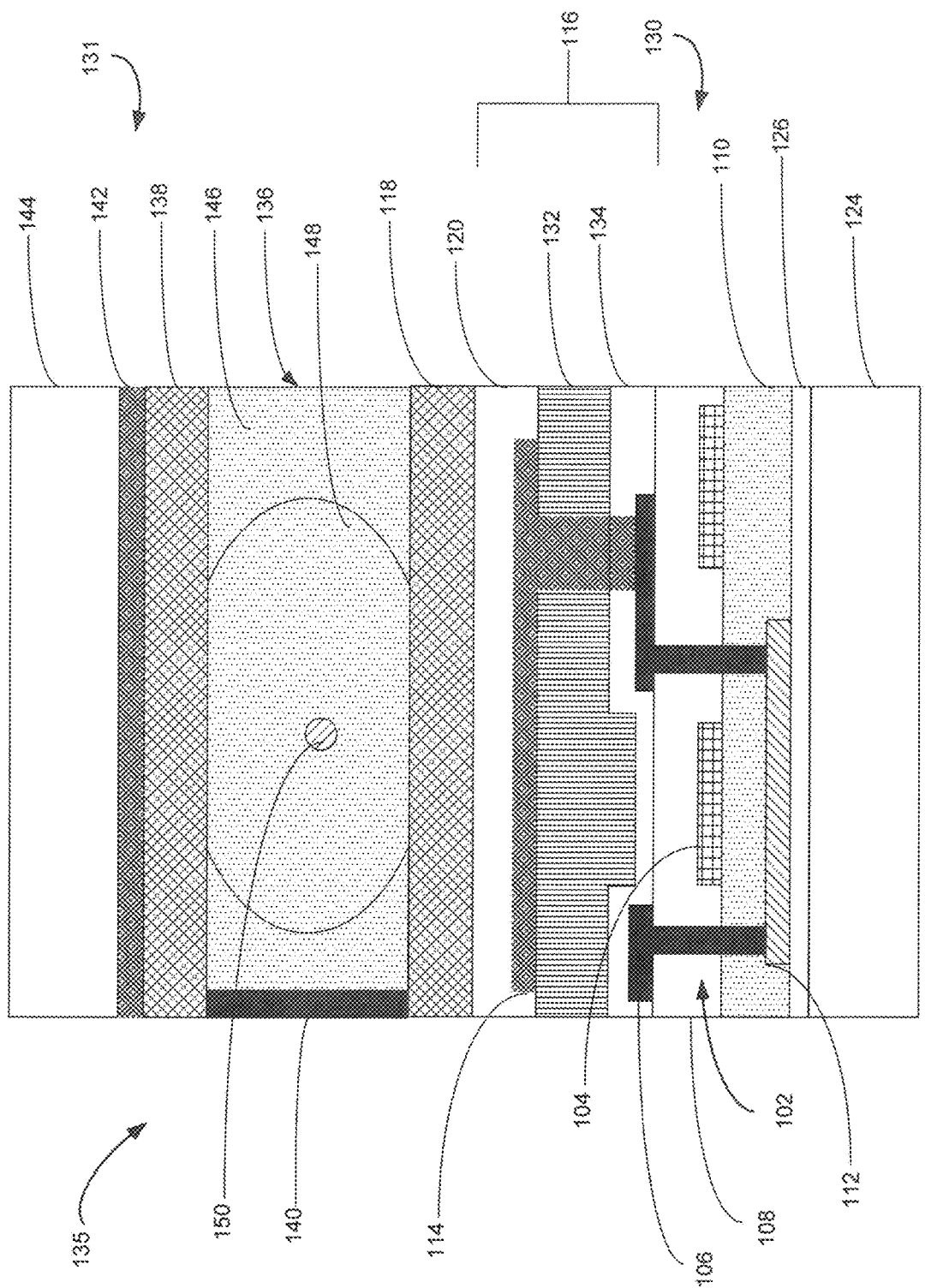
FIG. 7 is a drawing depicting a cross section through a portion of the array of an exemplary AM-EWOD device, which includes the layer stack of FIG. 6.

FIG. 7 is a drawing depicting a cross section through a portion of the array of an exemplary AM-EWOD device 135, which includes the layer stack 130 of FIG. 6 as the TFT substrate assembly. In this embodiment, the layer stack 130 constitutes a first substrate assembly having the patterned TFT electrode elements as described above. The AM-EWOD device 135 further includes a second substrate assembly 131 opposite and spaced apart from the first substrate assembly 130 to define a cell gap 136. In particular, the second substrate assembly 131 includes a second hydrophobic layer 138 that is spaced apart from the first hydrophobic layer 118 by a spacer 140, thereby defining the cell gap 136. A common or reference electrode 142 is disposed between the second hydrophobic layer 138 and a second glass substrate 144. As is conventional, a potential difference between the common or reference electrode 142 and the TFT electrodes 114 may be employed to perform droplet manipulations.

As shown in this example, the cell gap 136 may be filled with a non-polar fluid 146, such as a non-polar oil. Liquid droplets 148 may be dispensed into the oil 146 for performing any desired droplet manipulations and analyses. As an illustrated application that advantageously utilizes the current invention, the liquid droplet 148 may (or may not) contain as few as a single biological cell 150. The AM-EWOD is required to interrogate the liquid droplet 148 by optical detection methods to detect the presence or absence of the single cell 150, and/or relatedly to determine how many cells 150 are presence in the liquid droplet 148 and provide an accurate cell count.

The AM-EWOD device may be incorporated as part of microfluidic system to provide enhanced optical detection of a constituent with a liquid droplet. Another aspect of the invention, therefore, is a microfluidic system for measuring an optical property of a liquid droplet, which includes the AM-EWOD device according to any of the embodiments, wherein the liquid droplet is received within the cell gap of the AM-EWOD device, and an optical measurement apparatus that measures the optical property of the liquid droplet. The optical measurement apparatus includes an illumination source that emits illumination light rays that illuminate the liquid droplet, wherein a constituent that is present within the liquid droplet is excited by the illumination light rays and emits excitation light rays; and a photodetector that is positioned to detect the excitation light rays, wherein a constituent of the liquid droplet is determined based on the detection of the excitation light rays.

Figure 2:
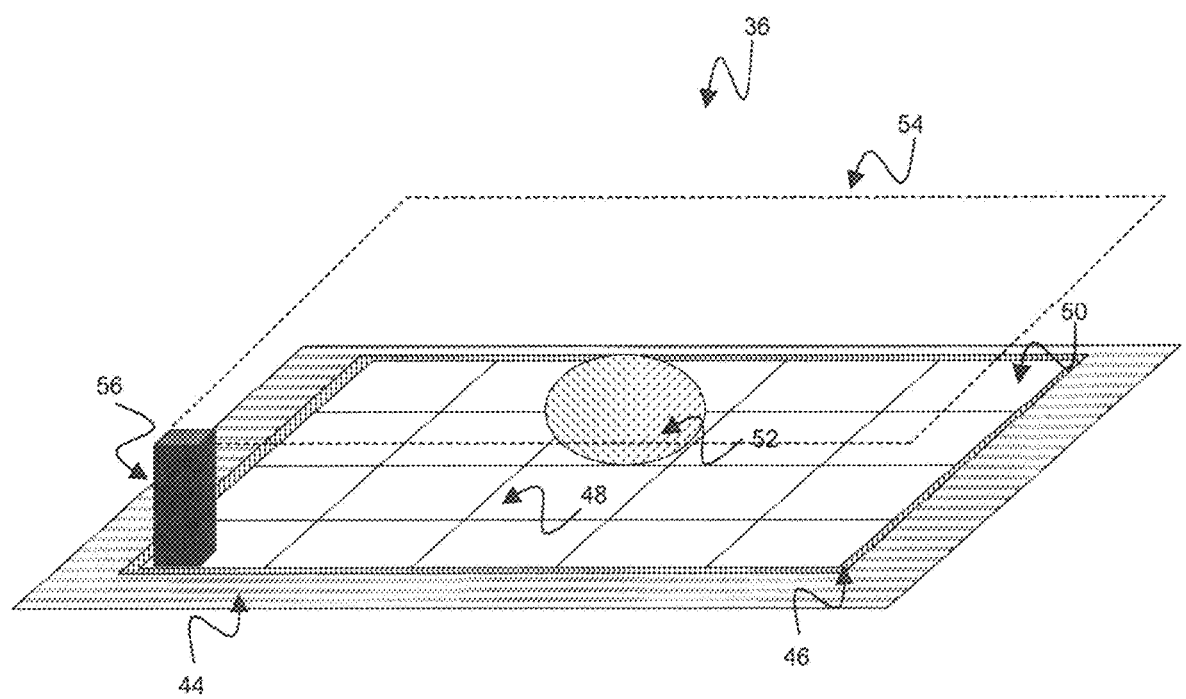
FIG. 2 is a drawing depicting an exemplary AM-EWOD device in schematic perspective.
Figure 3:
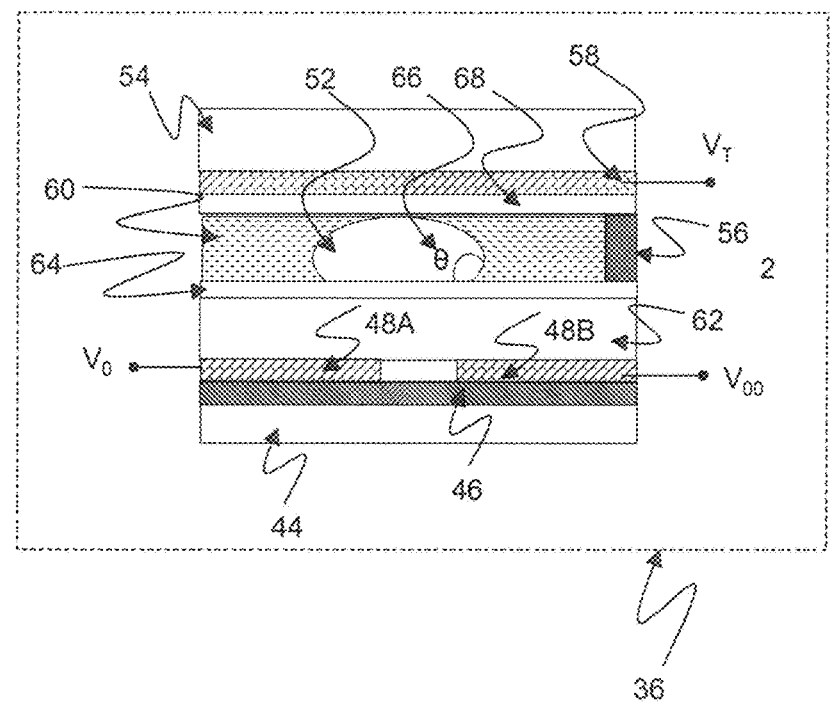
FIG. 3 is a drawing depicting a cross section through a portion of the array of the exemplary AM-EWOD device of FIG. 2.
Figure 4:
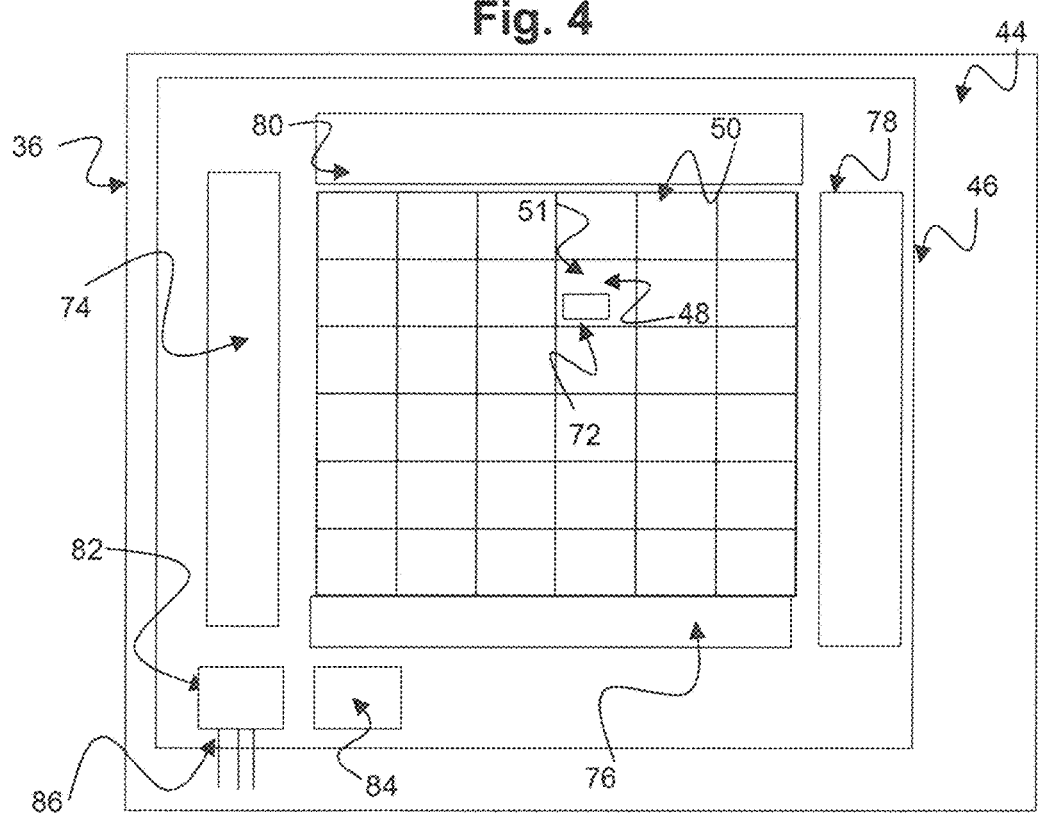
FIG. 4 is a drawing depicting an exemplary arrangement of thin film electronics in the exemplary AM-EWOD device of FIG. 2.
Figure 8:
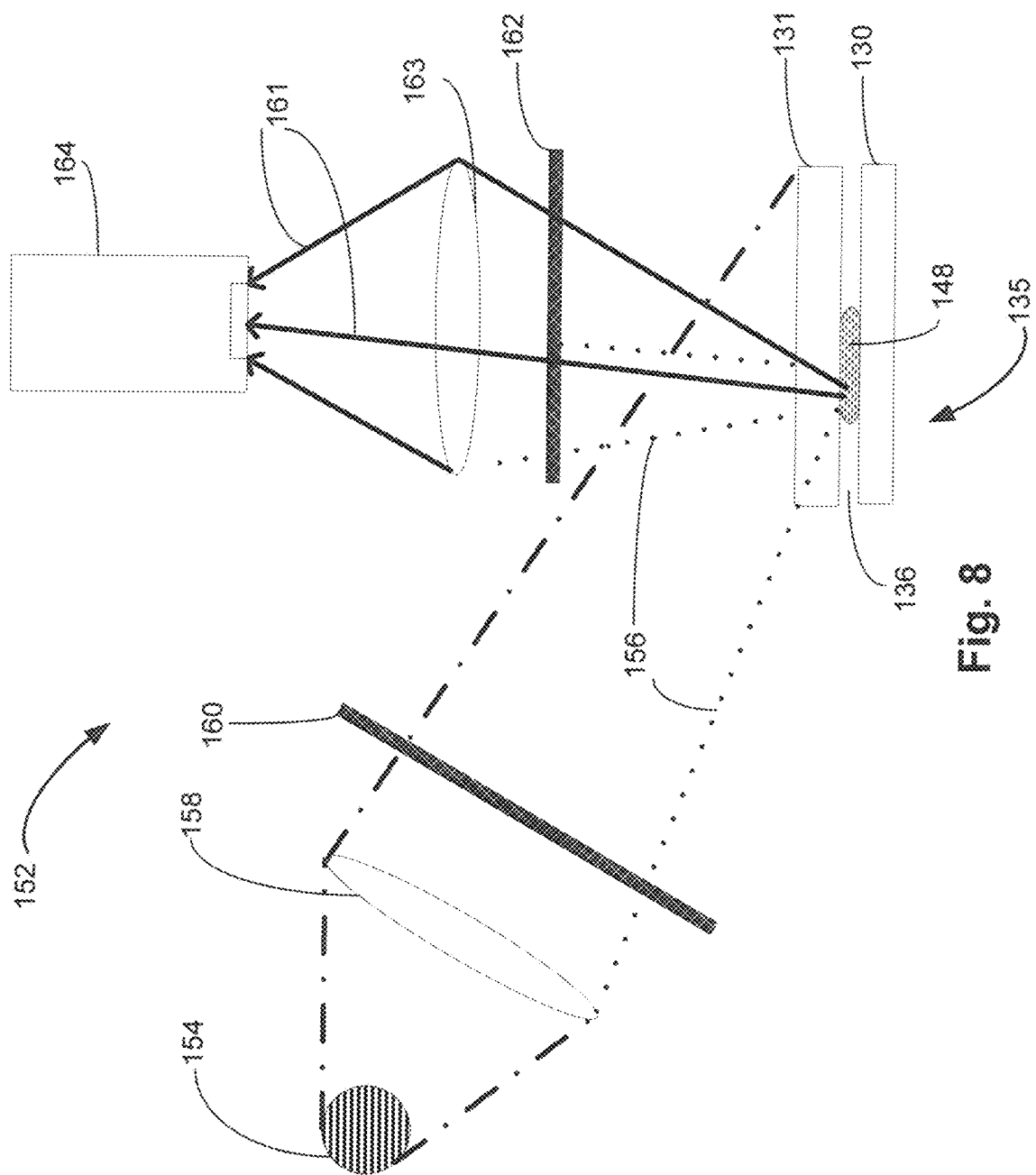
FIG. 8 is a schematic drawing depicting an exemplary microfluidic system in accordance with embodiments of the present invention.

FIG. 8 is a schematic drawing depicting an exemplary microfluidic system 152 in accordance with embodiments of the present invention, which is suitable for optical detection of cellular constituents within an AM-EWOD device. The microfluid system 152 employs the AM-EWOD device 135 described above, including the TFT substrate assembly 130 and the second substrate assembly 131 that define the cell gap 136. A representative liquid droplet 148 is shown, and it will be appreciated that the AM-EWOD device includes an array of elements (see, e.g., FIGS. 2 and 5) on which there may be dispensed any suitable number of liquid droplets that each may be subject to optical detection.

The microfluidic system 152 includes an illumination source 154 that emits light rays 156 of a wavelength that is selected to illuminate and excite a target constituent that may be contained within the liquid droplet 148. For example, when the target constituent is a biological cell, wavelengths within the UV range are suitable for excitation as to many types of cells as is known in the art. The illumination light rays 156 may be focused by a focusing lens 158, and passed through a first band pass filter 160 that substantially blocks light that is not of the desired wavelength to excite the constituent of the liquid droplet. The passed through illumination light rays 156 impinge upon the AM-EWOD device 135, with at least a portion of such light rays impinging upon the liquid droplet 148. Any target constituents, including even a single cell for example, fluoresce in response to receiving the illumination light rays 156, and in turn emit excitation light rays 161.

The excitation light rays 161 pass through a second band pass filter 162 that substantially blocks light that is not of a wavelength of the emitted excitation light rays 161. In this regard, any stray illumination light rays 156, such as light reflected from the layers of the AM-EWOD device, is blocked so as not to interfere with detection of the excitation light rays 161. The passed through excitation light rays 161 may be focused by a second focusing lens 163 to a photodetector 164. The photodetector 164 may be any suitable light detecting sensor, such as for example a CCD camera. Based on detection of the excitation light rays (including the presence or absence thereof), a determination can be made about constituents within the liquid droplet, including the presence of a single cell and/or cell counting. Such determinations may be made using any suitable control system. For example, the control system described with respect to FIG. 1, including any control electronics 38 executing software stored in the storage device 40, may be employed to analyze droplet constituents based on the optical detection.

The enhanced configuration of the AM-EWOD layer stack for the TFT substrate assembly, which incorporates an optically black planarization layer, improves optical detection of fluorescence which is suitable even for single cell detection as well as related cell counting. The optically black array element structure facilitates fluorescence detection of the liquid droplet (or species within the droplet, e.g. a cell), without interference of background fluorescence of the planarization layer or layers. The optically black array element structure also is non-reflective, which is especially advantageous for detecting a single cell in a droplet by means of fluorescence. In this situation a reflective electrode would problematic because reflections increase optical cross-talk and compromise imaging ability, which inhibits cell detection and counting in droplets. The optically black array element structure also is non-transparent. If the electrode elements were to be transparent, the underlying TFT structure would produce an unwanted background pattern, thereby compromising optical analysis of the droplet. In this manner, enhanced optical detection by fluorescence of constituents within a liquid droplet is improved as compared to conventional configurations.

Figure 9:
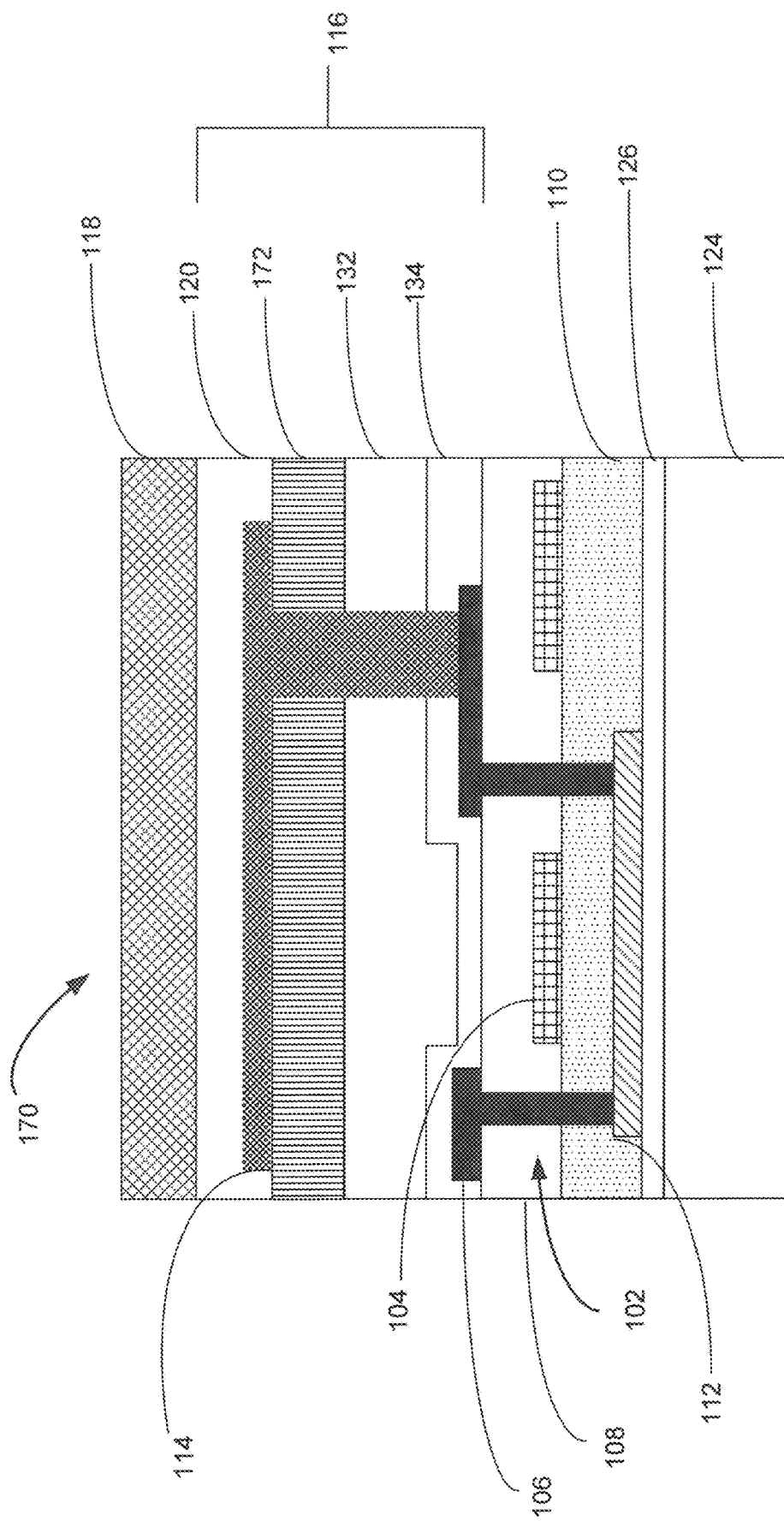
FIG. 9 is a drawing depicting another exemplary AM-EWOD layer stack for the TFT substrate assembly in accordance with embodiments of the present invention.
Figure 10:
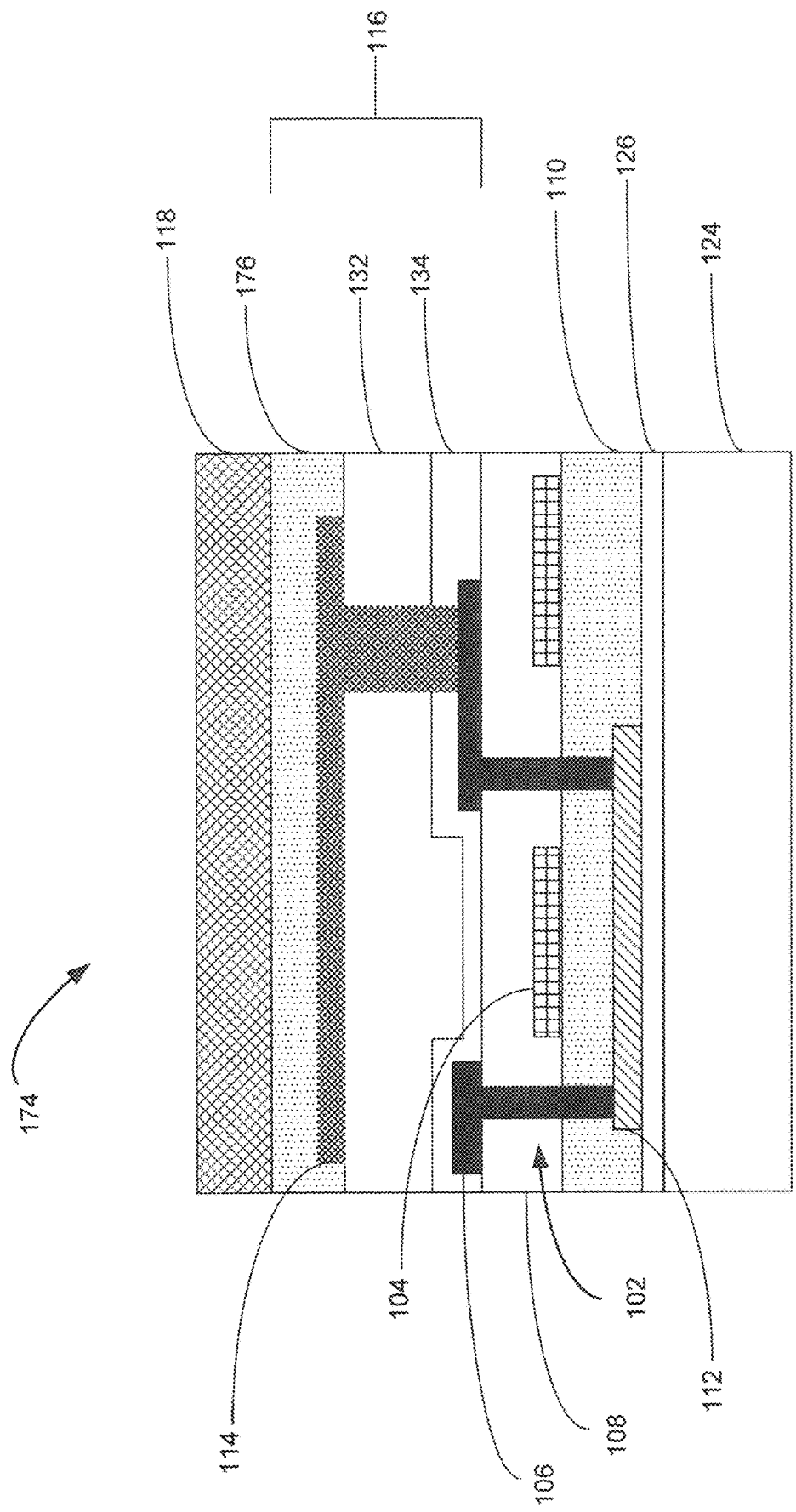
FIG. 10 is a drawing depicting another exemplary AM-EWOD layer stack for the TFT substrate assembly in accordance with embodiments of the present invention.

FIGS. 9 and 10 are drawings depicting other exemplary AM-EWOD layer stacks for use as the TFT substrate assembly in accordance with embodiments of the present invention, with alternative configurations of the optically black layer. In the embodiment of FIG. 9, a layer stack 170 includes a planarization structure in which the first and second planarization components 132 and 134 are made of conventional organic material that is not modified to be optically black. The planarization structure in this embodiment alternatively may be configured to have a unitary planarization structure comparable to the planarization layer 122 in the conventional configuration of FIG. 5. In the embodiment of FIG. 9, an additional optically black layer 172 is disposed between the first (upper) planarization component 132 and the ionic barrier layer 120. Suitable materials for the additional optically black layer 172 include those materials identified above in connection with FIG. 6, including for example amorphous silicon germanium, a black matrix material, or a standard semiconductor photoresist material including an inorganic pigment.

In the embodiment of a layer stack 174 of FIG. 10, the conventional planarization structure is modified such that the insulating ionic barrier layer is modified to include the optically black material. In the depicted example, an optically black ionic barrier 176 may be formed by configuring the ion barrier as an optically black organic insulator that includes an organic material modified to have an additional optically black material. An exemplary composition of the ionic barrier 176 is parylene that is modified to have an additional black material, such as for example carbon black, titanium dioxide, or any of the dyes or pigments identified in connection with FIG. 6. In addition to having at least an optically black component, the ionic barrier 176 may include one or more additional insulating layers composed of a more conventional material, such as for example silicon dioxide or silicon nitride.

An aspect of the invention, therefore, is an enhanced active matrix electro-wetting on dielectric (AM-EWOD) device that has an optically black array element structure to enhance optical detection of constituents within a liquid droplet. In exemplary embodiments, the AM-EWOD device includes a thin film transistor (TFT) substrate assembly having a hydrophobic layer; thin film electronics having a plurality of array elements arranged in an array of rows and columns, each of the array elements including an array element electrode and a TFT device; and an optically black material disposed between a plane of the TFT device and the hydrophobic layer. The AM-EWOD device further includes a second substrate assembly that is spaced apart from the TFT substrate assembly to define a cell gap. The AM-EWOD device may include one or more of the following features, either individually or in combination.

In an exemplary embodiment of the AM-EWOD device, the TFT substrate assembly further comprises a planarization structure that includes a component having the optically black material.

In an exemplary embodiment of the AM-EWOD device, the planarization structure comprises at least one planarization component disposed between the TFT device and the array element electrode, and an ionic barrier disposed between the array element electrode and the hydrophobic coating.

In an exemplary embodiment of the AM-EWOD device, the at least one planarization component comprises and organic material, and the ionic barrier comprises an inorganic material.

In an exemplary embodiment of the AM-EWOD device, the at least one planarization component includes the optically black material.

In an exemplary embodiment of the AM-EWOD device, the at least one planarization component including the optically black material comprises an organic polymer material and a black dye.

In an exemplary embodiment of the AM-EWOD device, the black dye is a non-fluorescent black dye.

In an exemplary embodiment of the AM-EWOD device, the black dye includes a fluorescent material, and the at least one planarization component including the optically black material further comprises a black dye absorber.

In an exemplary embodiment of the AM-EWOD device, the at least one planarization component including the optically black material comprises an organic polymer material and an inorganic black pigment.

In an exemplary embodiment of the AM-EWOD device, the inorganic black pigment is selected from a group consisting of carbon black, titanium oxide, manganese oxide, and graphite.

In an exemplary embodiment of the AM-EWOD device, the at least one planarization component including the optically black material is made of a natively optically black material.

In an exemplary embodiment of the AM-EWOD device, the natively black material is selected from a group consisting of amorphous silicon germanium, a black matrix material, and a photoresist material modified to include an inorganic black pigment.

In an exemplary embodiment of the AM-EWOD device, the at least one planarization component comprises a first planarization component and a second planarization component; the second planarization component is conformal relative to the TFT device, and the first planarization component is conformal relative to the second planarization component; and the first planarization component includes the optically black material.

In an exemplary embodiment of the AM-EWOD device, the TFT substrate assembly further comprises an additional optically black layer disposed between the at least one planarization component and the ionic barrier.

In an exemplary embodiment of the AM-EWOD device, the ionic barrier includes the optically black material.

In an exemplary embodiment of the AM-EWOD device, the ionic barrier comprises an inorganic insulator material modified to have an additional optically black material.

In an exemplary embodiment of the AM-EWOD device, the second substrate assembly comprises a second hydrophobic layer positioned oppositely form the first hydrophobic layer to define the cell gap, and a reference electrode disposed on a side of the second hydrophobic coating opposite from the cell gap.

Another aspect of the invention is a microfluidic system for measuring an optical property of a liquid droplet, which includes the AM-EWOD device according to any of the embodiments, wherein the liquid droplet is received within the cell gap of the AM-EWOD device, and an optical measurement apparatus that measures the optical property of the liquid droplet. The optical measurement apparatus includes an illumination source that emits illumination light rays that illuminate the liquid droplet, wherein a constituent that is present within the liquid droplet is excited by the illumination light rays and emits excitation light rays; and a photodetector that is positioned to detect the excitation light rays, wherein a constituent of the liquid droplet is determined based on the detection of the excitation light rays.

In an exemplary embodiment of the microfluidic device, the optical measurement apparatus further comprises: a first focusing lens that focuses the illumination light rays onto the AM-EWOD device, and a first band pass filter that blocks light that is not of a wavelength to excite the constituent of the liquid droplet; and a second focusing lens that focuses the excitation light rays onto the photodetector, and a second band pass filter that blocks light that is not of a wavelength of the excitation light rays.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The described embodiments could be used to provide an enhance AM-EWOD device. The AM-EWOD device could form a part of a lab-on-a-chip system. Such devices could be used for optical detection of biochemical or physiological materials, such as for cell detection and cell counting. Applications include healthcare diagnostic testing, material testing, chemical or biochemical material synthesis, proteomics, tools for research in life sciences and forensic science.

REFERENCE SIGNS LIST

32—reader
34—cartridge
35—external sensor module
36—AM-EWOD device
38—control electronics
40—storage device
44—lower substrate assembly
46—thin film electronics
48—array element electrodes
48A—array element electrode
48B—array element electrode
50—two-dimensional array of elements
51—array element
52—liquid droplet
54—top substrate
56—spacer
58—reference electrode
60—non-polar fluid
62—insulator layer
64—first hydrophobic coating
66—contact angle
68—second hydrophobic coating
72—array element circuit
74—integrated row driver
76—column driver
78—integrated sensor row addressing
80—column detection circuits
82—serial interface
84—voltage supply interface
86—connecting wires
100—AM-EWOD layer stack
102—thin film transistor (TFT) device
104—first metal component
106—second metal component
108—interlayer dielectric
110—gate dielectric
112—semiconductor layer
114—array element electrode
116—planarization structure
118—hydrophobic layer
120—insulating ion barrier
122—planarization layer
124—glass layer
126—basecoat layer
130—AM-EWOD layer stack
131—second substrate assembly
132—first planarization component
134—second planarization component
135—AM-EWOD device
136—cell gap
138—second hydrophobic layer
140—spacer
142—reference electrode
144—second glass substrate
146—non-polar oil
148—liquid droplet
150—single biological cell
152—microfluidic system
154—illumination source
156—illumination light rays
158—first focusing lens
160—first band pass filter
161—excitation light rays
162—second band pass filter
163—second focusing lens 164—photodetector
170—layer stack
172—optically black layer
176—optically black ionic barrier

What is claimed is:

1. An active matrix electro-wetting on dielectric (AM-EWOD) device comprising:
    a thin film transistor (TFT) substrate assembly comprising:
        a first hydrophobic layer;
        thin film electronics having a plurality of array elements arranged in an array of rows and columns, each of the array elements including an array element electrode and a TFT device; and
        an optically black material disposed between a plane of the TFT device and the first hydrophobic layer; and
    a second substrate assembly that is spaced apart from the TFT substrate assembly to define a cell gap.

2. The AM-EWOD device of claim 1, wherein the TFT substrate assembly further comprises a planarization structure that includes a component having the optically black material.

3. The AM-EWOD device of claim 2, wherein the planarization structure comprises at least one planarization component disposed between the TFT device and the array element electrode, and an ionic barrier disposed between the array element electrode and the hydrophobic coating.

4. The AM-EWOD device of claim 3, wherein the at least one planarization component comprises an organic material, and the ionic barrier comprises an inorganic material.

5. The AM-EWOD device of claim 3, wherein the at least one planarization component includes the optically black material.

6. The AM-EWOD device of claim 5, wherein the at least one planarization component including the optically black material comprises an organic polymer material and a black dye.

7. The AM-EWOD device of claim 6, wherein the black dye is a non-fluorescent black dye.

8. The AM-EWOD device of claim 6, wherein the black dye includes a fluorescent material, and the at least one planarization component including the optically black material further comprises a black dye absorber.

9. The AM-EWOD device of claim 5, wherein the at least one planarization component including the optically black material comprises an organic polymer material and an inorganic black pigment.

10. The AM-EWOD device of claim 9, wherein the inorganic black pigment is selected from a group consisting of carbon black, titanium oxide, manganese oxide, and graphite.

11. The AM-EWOD device of claim 5, wherein the at least one planarization component including the optically black material is made of a natively optically black material.

12. The AM-EWOD device of claim 11, wherein the natively black material is selected from a group consisting of amorphous silicon germanium, a black matrix material, and a photoresist material modified to include an inorganic black pigment.

13. The AM-EWOD device of claim 3, wherein:
    the at least one planarization component comprises a first planarization component and a second planarization component;
    the second planarization component is conformal relative to the TFT device, and the first planarization component is conformal relative to the second planarization component; and
    the first planarization component includes the optically black material.

14. The AM-EWOD device of claim 3, wherein the TFT substrate assembly further comprises an additional optically black layer disposed between the at least one planarization component and the ionic barrier.

15. The AM-EWOD device of claim 3, wherein the ionic barrier includes the optically black material.

16. The AM-EWOD device of claim 15, wherein the ionic barrier comprises an inorganic insulator material modified to have an additional optically black material.

17. The AM-EWOD device of claim 1, wherein the second substrate assembly comprises a second hydrophobic layer positioned oppositely form the first hydrophobic layer to define the cell gap, and a reference electrode disposed on a side of the second hydrophobic coating opposite from the cell gap.

18. A microfluidic system for measuring an optical property of a liquid droplet comprising:
    the AM-EWOD device according to claim 1, wherein the liquid droplet is received within the cell gap of the AM-EWOD device; and
    an optical measurement apparatus that measures the optical property of the liquid droplet.

19. The microfluidic device of claim 18, wherein the optical measurement apparatus comprises:
    an illumination source that emits illumination light rays that illuminate the liquid droplet, wherein a constituent that is present within the liquid droplet is excited by the illumination light rays and emits excitation light rays; and
    a photodetector that is positioned to detect the excitation light rays, wherein a constituent of the liquid droplet is determined based on the detection of the excitation light rays.

20. The microfluidic device of claim 19, wherein the optical measurement apparatus further comprises:
    a first focusing lens that focuses the illumination light rays onto the AM-EWOD device, and a first band pass filter that blocks light that is not of a wavelength to excite the constituent of the liquid droplet; and
    a second focusing lens that focuses the excitation light rays onto the photodetector, and a second band pass filter that blocks light that is not of a wavelength of the excitation light rays.

* * * * *